United States Patent [19]

Sali et al.

[11] Patent Number: 5,781,474
[45] Date of Patent: Jul. 14, 1998

[54] PARALLEL PROGRAMMING METHOD OF MEMORY WORDS AND CORRESPONDING CIRCUIT

[75] Inventors: Mauro Sali; Fabio Tassan Caser, both of Milan; Stefan Schippers, Peschiera Del Garda, all of Italy

[73] Assignee: SGS-Thomson Microelectronics, S.r.l., Agrate Brianza, Italy

[21] Appl. No.: 722,378

[22] Filed: Sep. 30, 1996

[30] Foreign Application Priority Data

Sep. 29, 1995 [EP] European Pat. Off. ............ 95830406

[51] Int. Cl.$^6$ .................................................. G11C 11/34
[52] U.S. Cl. ............................ 365/185.18; 365/185.2; 365/185.23
[58] Field of Search .................... 365/185.18, 185.2, 365/226, 185.23

[56] References Cited

U.S. PATENT DOCUMENTS

| 5,357,463 | 10/1994 | Kinney . | |
|---|---|---|---|
| 5,537,350 | 7/1996 | Larsen et al. | 365/185.18 X |
| 5,546,339 | 8/1996 | Oyama | 365/185.18 X |
| 5,576,990 | 11/1996 | Camerlenghi et al. | 365/185.2 X |

FOREIGN PATENT DOCUMENTS 8301146  3/1983  WIPO .

OTHER PUBLICATIONS

Zales et al., "Intel flash EPROM for in-system reprogrammable nonvolatile storage," Microproccessors and Microsystems, vol. 14, No. 8, Oct. 8, 1990, London, pp. 543–549.

Primary Examiner—David C. Nelms
Assistant Examiner—Huan Hoang
Attorney, Agent, or Firm—Robert Groover; Betty Formby

[57] ABSTRACT

A method for the parallel programming of memory words in electrically programmable non-volatile semiconductor memory devices comprising at least one matrix of floating gate memory cells with corresponding drain terminals heading columns or bit lines of the matrix and supplied during the programming stage with a drain voltage which is boosted with respect to a supply voltage (Vcc). During the parallel programming stage the supply voltage is used as a drain voltage. Switching is provided between the supply using the drain voltage or the supply voltage during the transient between single word programming and parallel programming.

20 Claims, 1 Drawing Sheet

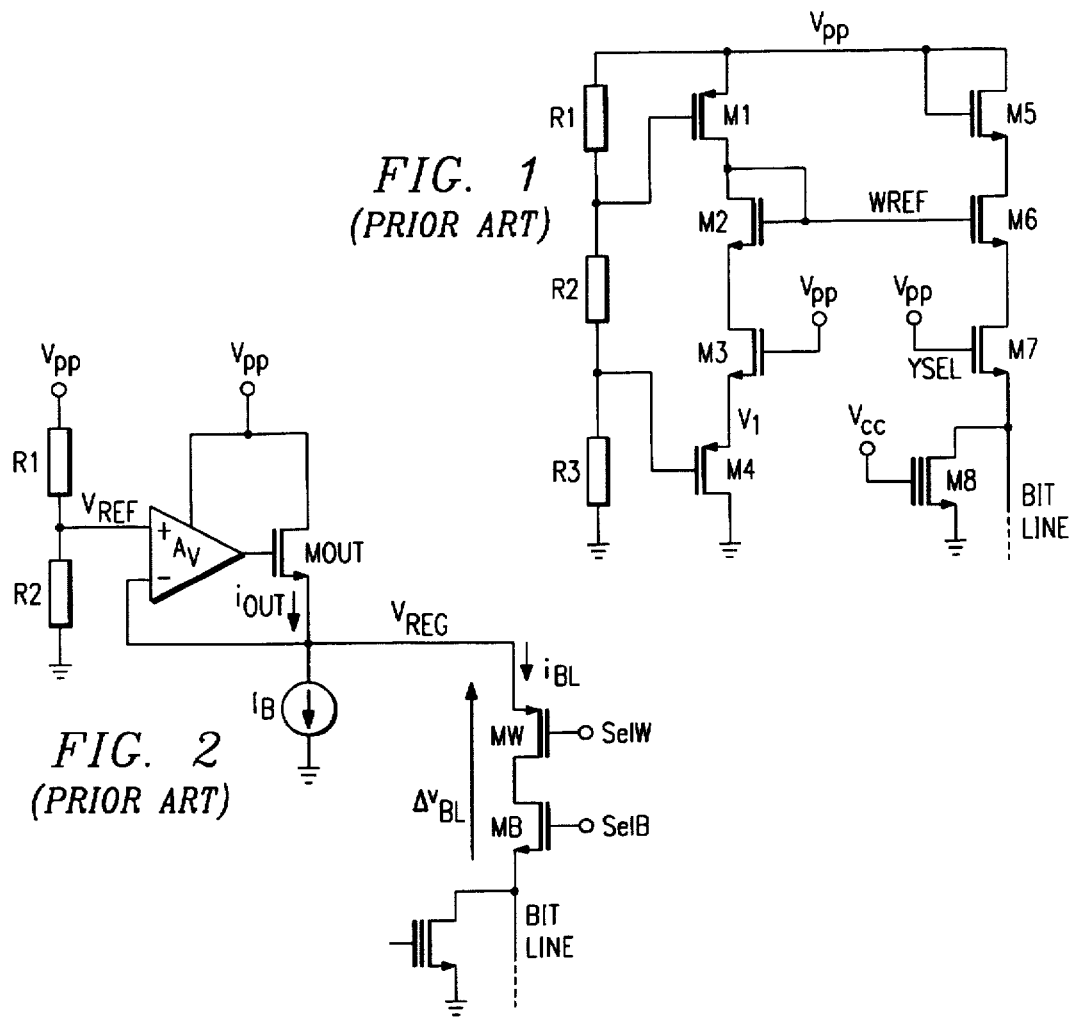
FIG. 1 (PRIOR ART)
FIG. 2 (PRIOR ART)
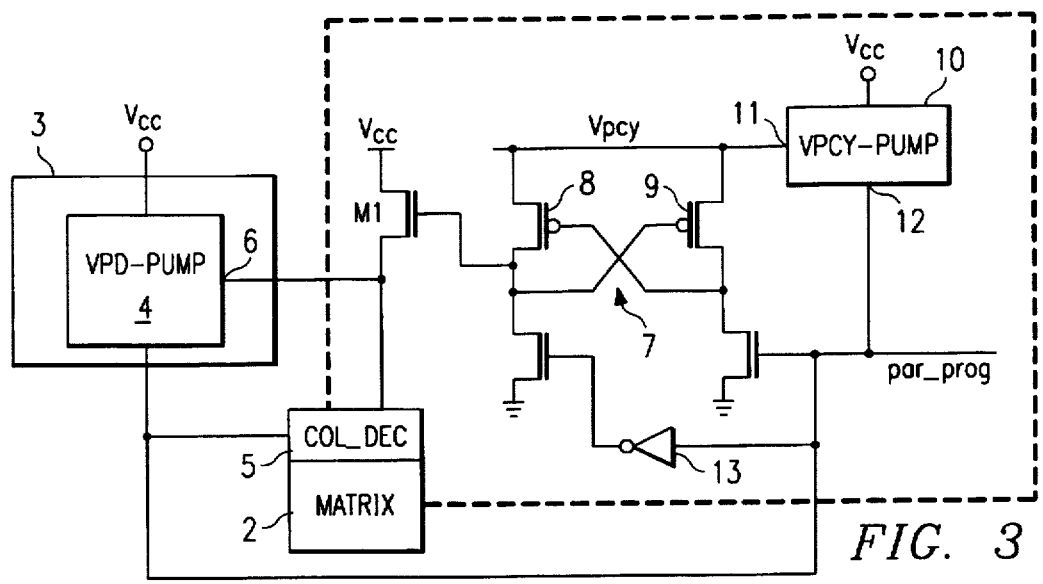
FIG. 3

PARALLEL PROGRAMMING METHOD OF MEMORY WORDS AND CORRESPONDING CIRCUIT

CROSS-REFERENCE TO RELATED APPLICATION

This application claims priority from European 95830406.5, filed Sep. 29, 1995, which is hereby incorporated by reference. However, the content of the present application is not necessarily identical to that of the priority application.

BACKGROUND AND SUMMARY OF THE INVENTION

This invention relates to a method for the parallel programming of memory words in electrically programmable non-volatile semiconductor memory devices comprising at least one matrix of floating gate memory cells with corresponding drain terminals heading columns or bit lines in the matrix, the said drain terminals being provided during the programming stage with a drain voltage which is boosted in comparison with the supply voltage.

The invention also relates to a circuit for the parallel programming of memory words in electrically programmable non-volatile semiconductor memory devices of the type comprising a drain voltage regulator provided with a voltage booster device to supply the columns or bit lines of a matrix of floating gate memory cells in which the corresponding drain terminals head the said columns.

As is well known, non-volatile memory devices which are integrated on semiconductors and which are electrically programmable comprise matrices of memory cells each of which comprises a floating gate MOS transistor.

Each transistor comprises a drain region and a source region, provided on the semiconductor substrate and separated by a channel region. A floating gate is provided above the substrate and separated from the latter by a thin layer of gate oxide.

A control gate is capacitatively coupled to the floating gate by means of a dielectric layer and metal electrodes are provided to form the drain, source and control gate in order that predetermined voltages can be applied to the memory cell.

The matrix of cells is organized in lines, called word lines, and columns, called bit lines. The cells belonging to the same word line have a common electrical line which controls the corresponding control gates, while the cells which belong to the same bit line have their drain terminals in common.

The amount of charge present in the floating gate can be varied by applying suitable voltages to the terminals of the cell. The operation by means of which charge is stored in the floating gate is called "programming".

Each individual cell is programmed by hot electron injection and allows electrons to be trapped in the floating gate when approximately 12 V is applied to the control gate while the source terminal is connected to earth and the drain terminal is held at a drain voltage of approximately 5.5 V.

During the programming stage each cell absorbs a current of approximately 400 µA from the drain. Thus a memory word consisting of one byte, that is an array of eight cells, requires a current of at least 3.2 mA.

It is known that the cells of non-volatile memories, in particular those of the FLASH type, require accurate control of the drain voltage applied to the bit line during the programming stage.

FIG. 1 shows schematically a first circuit solution of known type provided by utilizing division of the programming voltage.

The voltage regulator shown in FIG. 1 comprises a resistive divider consisting of three resistances R1, R2, R3 connected between the programming voltage line $V_{pp}$ and ground. In parallel with the resistances is a group of four MOS transistors connected in series with each other through their respective source and drain terminals.

The gate terminals of the first transistor M1 and fourth transistor M4 are connected between the first and second resistances and between the second and third resistances.

The voltage applied to the bit line is taken on the gate terminal of the second transistor M2 which is inserted in the circuit in diode configuration with gate and drain short-circuited.

This voltage is actually applied to the bit line unless there is a negative translation of level due to the presence of a first selection transistor M6 and a second selection transistor M7 for writing.

Although advantageous from certain viewpoints, this solution is not entirely effective and displays some shortcomings.

As already mentioned, the programming current absorbed by the memory cell can vary from one integrated circuit to another because of the inevitable variations inherent in the production process. It can undergo variations also because of the surrounding conditions in which the circuit is made to operate.

If the current passing through the bit line and hence the output stage of the regulator is actually different from the one called for by the design it follows that the voltage on the bit line will also be wrong or different from that desired.

In addition, since during programming the threshold voltage of the cell tends to rise progressively it follows that the current absorbed by the cell decreases in time. Since with the circuit described above voltage regulation is based on an average programming current, it will not give good results steadily.

A second solution of the known art is shown in FIG. 2 and provides that the drain voltage be supplied by a so-called source-follower piloted by an operational amplifier with appropriate feedback connections.

In typical systems, the optimum range for the drain voltage is generally rather small and typically lies between 5 and 6 V, and is preferably 5.5 V.

The drain voltage is generally slightly higher than the supply voltage and it is therefore desirable that it should be generated by means of a so-called charge pump.

For example a known technical arrangement described in U.S. Pat. No. 5,263,000, which is hereby incorporated by reference, provides that the drain voltage be provided by means of a voltage booster device fed by the dc supply voltage of 5V.

The value of the voltage provided by the voltage booster device is an optimum when the memory is programmed for an individual byte.

There are however other programming stages in which it is necessary to be able to program a number of bytes in parallel, for example four or eight bytes.

A typical example of this need occurs when testing the memory matrix. In fact, to reduce the duration of the test it is very important to be able to perform screening by programming several bytes in parallel.

We have seen however that each byte takes up a current of at least 3.2 mA during the programming stage. Therefore the simultaneous programming of four bytes requires at least 12.8 mA, while the programming of eight bytes requires the provision of at least 25.6 mA.

Unfortunately the current provided by the voltage booster device is proportional to the value of the capacitance incorporated within it. Thus in order to be able to deliver 25.6 mA at a voltage of 5.5 V it will be necessary to provide a voltage booster device having quite a substantial circuit size.

This would compromise the reliability of the voltage booster device and would greatly reduce the ratio between the circuit area occupied by the voltage booster device and the overall area of the memory.

Substantially, parallel programming sets the problem of how to provide a voltage booster device of small dimensions which is nevertheless capable of delivering a relatively high current.

The technical problem underlying this invention is that of devising a method of parallel programming and a corresponding circuit which makes it possible to satisfy the current requirement of the memory cells with maximum reliability while maintaining the ratio between the area occupied by the voltage booster device and the matrix of cells as high as possible, thus overcoming the limitations of the current arrangements provided by the known art.

The concept underlying this invention is that of maintaining the structure of the voltage booster device designed for the programming of individual bytes and using the supply voltage Vcc as the supply to the drain during the parallel programming stage.

On the basis of this concept the technical problem is solved by a method as described herein and in the claims.

The technical problem is also resolved by a circuit for implementing the said method as described herein and claimed below.

The features and advantages of the method and circuit according to the invention will be apparent from the following description of an embodiment given by way of a non-restrictive illustration with reference to the appended drawing.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 1 shows a diagram of a programming circuit incorporating a voltage regulator achieved in accordance with the known art.

FIG. 2 shows another diagram of a programming circuit incorporating another voltage regulator of known type.

FIG. 3 shows a diagram of a programming circuit constructed in accordance with this invention.

DETAILED DESCRIPTION OF THE PREFERRED EMBODIMENTS

The numerous innovative teachings of the present application will be described with particular reference to the presently preferred embodiment (by way of example, and not of limitation), in which:

With reference to these figures, FIG. 3 shows a diagram for a programming circuit for electrically programmable and cancelable non-volatile memory cells, for example cells of the FLASH type.

The circuit of FIG. 3 is designed in particular, but not exclusively, for a single power supply memory 2 connected to a DC supply reference voltage of 5 V.

The circuit of FIG. 3 is associated with a voltage regulator 3 incorporating a charge pump. More particularly, voltage regulator 3 comprises a voltage booster device 4, that is a charge pump circuit fed by the supply voltage Vcc.

The magnitude of the voltage generated at the output from the voltage booster device depends on the supply voltage Vcc and the current which has to be provided; the latter depends on the number of bits which have to be programmed (from 0 to 8).

Memory 2 is organized as a matrix of cells arranged in lines, called word lines, and columns called bit lines. The cells belonging to the same word line WL have in common an electrical line which controls the corresponding control gates, while the cells belonging to the same bit line have their drain terminals in common.

In the figure matrix 2 is illustrated diagrammatically by way of example with an associated column decoder 5 fed by an output 6 from voltage regulator 3.

Advantageously, according to the invention, a connection is also provided between supply reference voltage Vcc and decoder 5. This connection makes it possible to transfer the supply voltage Vcc to the drain terminals of the memory cells at predetermined times, and in particular during the parallel programming stage.

A transistor M1 of the N-channel MOS type, with the drain terminal connected to the supply reference voltage Vcc and the source terminal connected to decoder 5 is inserted in this connection.

The gate terminal of transistor M1 is connected to the output of an enabling circuit 7 comprising a first 8 and a second 9 complementary pair of MOS transistors.

Each pair 8, 9 comprises the sequence of a P-channel transistor and an N-channel transistor inserted between a voltage pole Vpcy and a second reference voltage, for example a signal earth GND.

The voltage Vpcy is provided by an output 11 from a second voltage booster device 10 fed by the 5 V supply voltage Vcc.

A cross connection is provided between the gate terminal of the P-channel transistor of first pair 8 and the interconnection node between the transistors of the second pair 9. Similarly a cross connection is provided between the gate terminal of the P-transistor of the second pair 9 and the interconnection node between the transistors of the first pair 8.

The gate terminal of the N-channel transistor of complementary second pair 9 receives an enabling voltage signal indicated by the term par-prog.

This signal is also applied to an input 12 in the second voltage booster device 10 and to the gate terminal of the N-channel transistor of the other complementary pair 8 via an inverter 13.

Advantageously the par-prog signal is also applied to an input of regulator 3 and decoder 5.

The structure of the circuit according to the invention is particularly simple and easy to understand.

The parallel programming stage is initiated by the output front of the par-prog signal which enables switching of the supply to the drain terminals of matrix cells 2.

During the stage of single byte programming the par-prog signal has a low logic value and the voltage for the bit lines of matrix 2 is provided by regulator 3 which operates normally according to specification.

During this stage transistor M1 is inactive and disconnects decoder 5 from supply Vcc. Transistor M1 operates essentially as a pass-gate.

The method according to the invention therefore provides that voltage booster device 4 remains active during the single byte programming stage; in the meanwhile supply voltage Vcc is used as a supply for the drain during parallel programming.

When it is necessary to activate the parallel programming of a number of bytes, the drain voltage is provided directly from the supply Vcc, which has no problems in providing all the current which the cells require.

The supply voltage Vcc is transferred to the drain terminals of the memory cells by means of transistor M1 which is suitably dimensioned for this purpose, including a thicker gate oxide.

The gate terminal of this transistor M1 is boosted to the value of voltage Vpcy by means of enabling circuit 7.

The par-prog signal activates the N-Channel transistor of second complementary pair 9 which makes it possible for voltage Vpcy to be applied to the gate of transistor M1.

The increased voltage Vpcy is already available in the circuitry associated with memory matrix 2, and therefore its use to enable transistor M1 is advantageous in order to reduce the voltage drop in that transistor.

The invention solves the technical problem and provides many advantages. Among these, the most important is due to the fact that use of only N-Channel transistor M1 as a pass-gate makes a P-Channel type switch between the output 6 of the regulator and the supply reference voltage Vcc superfluous.

This makes it possible to reduce the size of the circuit area; in addition to this, the conductivity of the N-Channel pass-gate is greater than that of any P-Channel switch.

These and other advantages make it possible to make a series of modifications and variants to the invention which nevertheless fall within the scope of the following claims.

According to a disclosed class of innovative embodiments, there is provided a circuit for the parallel programming of multiple cells of electrically programmable non-volatile semiconductor memory devices, comprising; a column decoder connected to bit lines of a floating gate memory cell matrix; a regulated drain voltage connected to said column decoder; first and second reference voltages connected to respective source and control gate terminals of each cell of said matrix; a switch connected between a supply voltage source and said column decoder; an enable signal connected to turn on said switch when multiple bytes of said cells are to be programmed in parallel; wherein said regulated drain voltage is higher than said supply voltage.

According to another disclosed class of innovative embodiments, there is provided a method for programming electrically programmable non-volatile semiconductor memory devices having a matrix of memory cells, comprising the steps of: connecting a source terminal of each cell to be programmed to a first reference voltage; connecting a control gate terminal of each cell to be programmed with a second reference voltage; if a single byte is to be programmed, then connecting a drain terminal of each cell with a boosted voltage; and if multiple bytes are to be programmed in parallel, then connecting said drain terminals of each cell to be programmed with a supply voltage; wherein said boosted voltage is higher than said supply voltage.

According to another disclosed class of innovative embodiments, there is provided: A method for the parallel programming of memory words in electrically programmable non-volatile semiconductor memory devices comprising at least a matrix of memory cells with a floating gate with corresponding drain terminals heading columns or bit lines of the matrix, the said drain terminals being supplied during the programming stage with a drain voltage which is increased with respect to a supply voltage, characterized in that during the parallel programming stage this supply voltage is used as a drain voltage.

According to another disclosed class of innovative embodiments, there is provided: A circuit for the parallel programming of memory words in electrically programmable non-volatile semiconductor memory devices, of the type comprising a drain voltage regulator provided with a voltage booster device to supply the columns or bit lines of a floating gate memory cell matrix in which the corresponding drain terminals head the said columns, characterized in that it comprises a connection which is normally open between a supply reference voltage and a decoder for the said columns and a switch which is subject to a closing enabling signal to supply the supply voltage to the said drain terminals during parallel programming of the said memory words.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, within the constraints well-known to those of ordinary skill, nonlinear devices can be added in series with (or used to replace) resistors, to increase the impedance of load devices.

What is claimed is:

1. A circuit for the parallel programming of multiple cells of electrically programmable non-volatile semiconductor memory devices, comprising:

a column decoder connected to bit lines of a floating gate memory cell matrix;

a regulated drain voltage connected to said column decoder;

first and second reference voltages connected to respective source and control gate terminals of each cell of said matrix;

a switch connected between a supply voltage source and said column decoder;

an enable signal connected to turn on said switch when multiple bytes of said cells are to be programmed in parallel;

wherein said regulated drain voltage is higher than said supply voltage.

2. A circuit according to claim 1, wherein said switch is a pass-gate.

3. A circuit according to claim 2, wherein said pass-gate is an N-Channel MOS transistor.

4. A circuit according to claim 1, wherein said switch is functionally connected to an enabling circuit comprising at least one complementary pair of MOS transistors inserted between a boosted reference voltage and said first reference voltage.

5. A circuit according to claim 1, wherein said switch is a MOS transistor to the gate terminal of which the said enabling signal is applied.

6. A circuit according to claim 5, wherein said enabling signal transfers a voltage which is boosted with respect to the said supply voltage to the said gate terminal.

7. A method for programming electrically programmable non-volatile semiconductor memory devices having a matrix of memory cells, comprising the steps of:

connecting a source terminal of each cell to be programmed to a first reference voltage;

connecting a control gate terminal of each cell to be programmed with a second reference voltage;

if a single byte is to be programmed, then connecting a drain terminal of each cell with a boosted voltage; and if multiple bytes are to be programmed in parallel, then connecting said drain terminal of each cell to be programmed with a supply voltage;

wherein said boosted voltage is higher than said supply voltage.

8. A method according to claim 7, wherein a switch is provided between said drain terminals and said supply voltage during the transient between single byte programming and multiple-byte parallel programming.

9. A method according to claim 7, wherein a connection is provided between a supply reference voltage and a column decoding circuit portion of the said matrix with an inserted pass-gate.

10. A method according to claim 9, characterized in that the said pass-gate is an N-Channel MOS transistor with a gate terminal functionally connected to a parallel programming enabling circuit.

11. A method for the parallel programming of memory words in electrically programmable non-volatile semiconductor memory devices comprising at least a matrix of memory cells with a floating gate with corresponding drain terminals heading columns or bit lines of the matrix, the said drain terminals being supplied during the programming stage with a drain voltage which is increased with respect to a supply voltage, characterized in that during the parallel programming stage this supply voltage is used as a drain voltage.

12. A method according to claim 11, characterized in that a switch is provided between the drain supply voltage and the supply voltage during the transient between single word programming and parallel programming.

13. A method according to claim 11, characterized in that a connection is provided between a supply reference voltage and a column decoding circuit portion of the said matrix with an inserted pass-gate.

14. A method according to claim 13, characterized in that the said pass-gate is an N-Channel MOS transistor with a gate terminal subject to a parallel programming enabling circuit.

15. A circuit for the parallel programming of memory words in electrically programmable non-volatile semiconductor memory devices, of the type comprising a drain voltage regulator provided with a voltage booster device to supply the columns or bit lines of a floating gate memory cell matrix in which the corresponding drain terminals head the said columns, characterized in that it comprises a connection which is normally open between a supply reference voltage and a decoder for the said columns and a switch which is subject to a closing enabling signal to supply the supply voltage to the said drain terminals during parallel programming of the said memory words.

16. A circuit according to claim 15, characterized in that the said switch is a pass-gate.

17. A circuit according to claim 16, characterized in that the said pass-gate is an N-Channel MOS transistor.

18. A circuit according to claim 15, characterized in that the said switch is subject to an enabling circuit comprising at least one complementary pair of MOS transistors inserted between a first boosted reference voltage and a second reference voltage.

19. A circuit according to claim 15, characterized in that the said switch is a MOS transistor to the gate terminal of which the said enabling signal is applied.

20. A circuit according to claim 16, characterized in that the said enabling signal transfers a voltage which is boosted with respect to the said supply voltage to the said terminal.

* * * * *